(12) United States Patent
Birner et al.

(10) Patent No.: US 8,441,114 B2
(45) Date of Patent: May 14, 2013

(54) ELECTRONIC CIRCUIT COMPOSED OF SUB-CIRCUITS AND METHOD FOR PRODUCING

(75) Inventors: Martin Birner, Hirschau (DE); Rainer Kreutzer, Weiden (DE); Hubert Schierling, Erlangen (DE); Norbert Seliger, Zorneding (DE)

(73) Assignee: Siemens Aktiengesellschaft, Munich (DE)

( * ) Notice: Subject to any disclaimer, the term of this patent is extended or adjusted under 35 U.S.C. 154(b) by 359 days.

(21) Appl. No.: 12/733,929

(22) PCT Filed: Sep. 3, 2008

(86) PCT No.: PCT/EP2008/061599
§ 371 (c)(1),
(2), (4) Date: Aug. 19, 2010

(87) PCT Pub. No.: WO2009/043670
PCT Pub. Date: Apr. 9, 2009

(65) Prior Publication Data
US 2010/0309633 A1 Dec. 9, 2010

(30) Foreign Application Priority Data
Sep. 28, 2007 (DE) .......................... 10 2007 046 969

(51) Int. Cl.
*H01L 23/22* (2006.01)
(52) U.S. Cl.
USPC ........... 257/687; 257/706; 257/703; 438/111; 438/112; 438/122; 438/124; 438/126

(58) Field of Classification Search .................. 257/687, 257/659, 706, 703; 438/111, 112, 122, 124, 438/126, 127
See application file for complete search history.

(56) References Cited

U.S. PATENT DOCUMENTS

| | | | |
|---|---|---|---|
| 5,835,362 A | 11/1998 | Keller et al. | |
| 5,982,031 A | 11/1999 | Stockmeier | |
| 6,207,221 B1 | 3/2001 | Schulz-Harder | |
| 6,597,063 B1 * | 7/2003 | Shimizu et al. | 257/687 |
| 7,061,100 B2 * | 6/2006 | Iwaki et al. | 257/706 |
| 2003/0189246 A1 * | 10/2003 | Iwaki et al. | 257/706 |
| 2004/0056346 A1 | 3/2004 | Palm et al. | |
| 2005/0012190 A1 | 1/2005 | Manz et al. | |
| 2006/0001152 A1 | 1/2006 | Hu | |
| 2007/0145540 A1 * | 6/2007 | Mochida | 257/659 |
| 2007/0296078 A1 | 12/2007 | Bakran et al. | |
| 2009/0046456 A1 | 2/2009 | Urano et al. | |

FOREIGN PATENT DOCUMENTS

| | | |
|---|---|---|
| DE | 195 12 679 C1 | 11/1996 |
| DE | 197 26 534 A1 | 12/1998 |
| DE | 103 16 356 A1 | 11/2004 |
| DE | 103 20 877 A1 | 12/2004 |

(Continued)

OTHER PUBLICATIONS

Japanese Office Action dated Feb. 14, 2012 issued in corresponding Japanese Patent Application No. 2010-526235.

(Continued)

*Primary Examiner* — Telly Green
(74) *Attorney, Agent, or Firm* — Staas & Halsey LLP

(57) ABSTRACT

To improve manufacture of an electronic circuit, the electronic circuit is composed of modules of sub-circuits arranged on a common substrate, such as a cooling body, and that are electrically interconnected by a planar electrical contact element.

17 Claims, 5 Drawing Sheets

FOREIGN PATENT DOCUMENTS

| | | |
|---|---|---|
| DE | 10 2004 007 009 A1 | 9/2005 |
| DE | 10 2004 061 907 A1 | 7/2006 |
| JP | 2011-18987 A | 4/2001 |
| JP | 2004-47617 A | 2/2004 |
| JP | 2007-59371 | 3/2007 |
| WO | 02/49104 A2 | 6/2002 |

OTHER PUBLICATIONS

International Search Report for Application No. PCT/EP208/061599; mailed Mar. 26, 2009.
Korean Office Action issued Jun. 28, 2011 in corresponding Korean Patent Application 10-2010-7009233.

* cited by examiner

ELECTRONIC CIRCUIT COMPOSED OF SUB-CIRCUITS AND METHOD FOR PRODUCING

CROSS REFERENCE TO RELATED APPLICATIONS

This application is the U.S. national stage of International Application No. PCT/EP2008/061599, filed Sep. 3, 2008 and claims the benefit thereof. The International Application claims the benefits of German Application No. 10 2007 046 969.3 filed on Sep. 28, 2007, both applications are incorporated by reference herein in their entirety.

BACKGROUND

Described below are a method for producing an electronic circuit and an electronic circuit.

In the production of electronic circuits there is a trend toward ever higher integration, that is to say toward accommodating more and more electronic components such as, for example, semiconductor chips on a carrier for the electronic circuit, for example a ceramic substrate, and thus toward producing ever more complex and more extensive electronic circuits. Although the yield in the production of an electronic circuit decreases as a result of the high integration and complexity, more cost-effective production overall is nevertheless achieved as a result.

In power electronic circuits, that is to say circuits having components appertaining to power electronics, one particular boundary condition for production is that a considerable amount of heat loss occurs in the power electronic circuit. This limits the possible packing density for the power electronic components, since the heat loss thereof has to be dissipated and the temperature of the power electronic components, primarily in the case of semiconductor components, must not exceed specific temperature limits. In this way, an increasing integration of more complex circuits on a substrate leads to circuits that are enlarged overall. Such circuits, however, in turn have their own disadvantages. Thus, the reliability of such an arrangement is reduced, especially in the case of cyclic thermal loading, since fatigue readily occurs at the interface between insulating carrier material and copper layer. Moreover, the high operating temperature of power electronic circuits leads to warpage of large-area substrates, which makes heat dissipation more difficult. Finally, the heat dissipation is also dependent on the best possible mechanical connection between a cooler and the substrate. The larger the substrate, the more stringent the requirements made of the cooler connected thereto, for example the planarity of the surface of the cooler.

SUMMARY

An aspect is specifying a method which makes it possible to produce an electronic circuit which substantially avoids or reduces the disadvantages indicated above. A further aspect an electronic circuit which avoids or reduces the disadvantages mentioned above.

In the production method for an electronic circuit described below, first at least two electronic sub-circuits are produced, the sub-circuits each having at least one electronic component on a separate insulating sub-carrier. Second, the sub-circuits are arranged alongside one another on a common carrier. Third, the sub-circuits are electrically connected by a method for planar contact-connection, the method for planar contact-connection including at least the deposition of a metallic layer.

The electronic circuit described below has at least two electronic sub-circuits, wherein the sub-circuits each have at least one electronic component on a respective separate insulating sub-carrier, are arranged alongside one another on a common carrier, and are electrically connected by a planar contact-connection. In this case, the planar electrical contact-connection has at least one metallic layer which at least partly bridges the sub-circuits.

The insulating sub-carriers can be simple ceramic substrates, by way of example. Furthermore, DCBs (DCB=Direct Copper Bonding) can be involved, by way of example. A DCB typically has an insulating ceramic substrate in conjunction with two planar copper conductor tracks applied on each side of the substrate. One or a plurality of electronic components such as, for example, resistors, capacitors, diodes or transistors are situated on the sub-carriers. Alongside individual electronic components, the sub-carriers can also have entire chips, which themselves in turn contain one or a plurality of electronic components.

The sub-circuits are arranged alongside one another, that is to say adjacent to one another, on a common carrier. In this case, a very dense arrangement of the sub-circuits close to one another advantageously provides for a small size of the electronic circuit. As an alternative, however, a larger distance between the sub-circuits leads to an improved distribution of heat loss that arises in the sub-circuits. The metallic layer providing for an electrical connection between the sub-circuits may be a layer composed of copper.

The production method and the electronic circuit described below have a series of advantages. Thus, the entire electronic circuit is decomposed into smaller sub-circuits, the smaller sub-circuits overall leading to an increased reliability of the entire electronic circuit since a cyclic thermal loading of the sub-circuits leads to reduced material fatigue. Furthermore, the smaller sub-circuits warp, at an elevated operating temperature, to a lesser extent than would a large overall circuit. As a result, firstly a better heat dissipation is possible, if, by way of example, a sub-circuit is in contact with a cooler. Furthermore, reduced requirements can be made of the surface of such a cooler, for example the planarity thereof.

The planar metallic layer serving for electrically connecting the sub-circuits furthermore provides for a low-inductance connection between the sub-circuits.

The processing of such circuits also becomes more favorable since an optimum utilization of circuit boards is achieved as a result of the combination of different circuit possibilities. The construction composed of sub-circuits furthermore permits a modularity in the power spectrum since, as a result of two or more identical sub-circuits being connected in parallel, for example, it is possible to produce electronic circuits having a higher overall power. Finally, an improvement arises as a result of a basic form of the sub-carrier being ideally utilized. Thus, as an example as a sub-carrier it is possible to use a DCB that is utilized ideally, while a simpler type of substrate such as, for example, a simple ceramic substrate can be used as a common carrier.

It is particularly advantageous if at least some of the components which are provided on the sub-circuits are those appertaining to power electronics. The electronic circuit is therefore a power electronic circuit. Precisely power electronic circuits usually have a high operating temperature of 100° C. or more. The advantages of the electronic circuit and of the production method which have already been mentioned initially are especially applicable in this case. In particular, the sub-circuits are small in comparison with the overall circuit and, as a result of this, the warpage arising as a result of the operating temperature is reduced and the heat dissipation is improved as a result. Furthermore, the requirements made of the construction of a cooler are also reduced as a result.

In a further advantageous configuration and development, one or a plurality of electrical connections within the sub-circuits are also produced by the planar contact-connection. This means that, by way of example, a previous wiring or some other contact-connection within the sub-circuits can be omitted since it is produced by the planar contact-connection. This leads to a particular simplification in the production of the electronic circuit and thus to a particular saving of costs and resources. In this case, electrical connections to connecting terminals or other connection elements are also produced by the planar contact-connection.

In a further advantageous configuration and development, the common carrier is a heat sink. One example of such a heat sink is a block composed of copper or high-grade steel and provided with cooling fins. The use of a further insulating substrate, which causes costs, is advantageously avoided as a result. Furthermore, the direct construction of the sub-circuits on a heat sink enables an ideal distribution of heat loss that arises in the sub-circuits.

In a configuration, to produce the planar contact-connection, firstly an insulation film for electrical insulation is applied to the common carrier and the sub-circuits situated thereon. Furthermore, the metallic layer that is part of the planar contact-connection and provides for the electrical connection is electrolytically applied to the insulation film. In order to achieve an electrical connection to contact areas lying below the insulation film, after the insulation film has been applied, windows are opened in the insulation film at suitable locations. Furthermore, it is possible, prior to electrolytically applying the metallic layer, to apply a metallic starter layer, for example by sputtering. The insulation film here advantageously permits an electrical insulation of the metallic layer and conductive layers already present, such as, for example, a copper base layer of a DCB used as sub-carrier. The process of electrolytically applying the metallic layer is a mild procedure in which layers having high thicknesses of up to 500 μm can nevertheless be produced.

In a further advantageous configuration, after the metallic layer has been applied, a further electrically insulating layer is applied to the previous construction. The further electrically insulating layer therefore covers the metallic layer, the underlying insulating layer, and also all the sub-circuits and the common carrier.

It is particularly advantageous if two, several, or all of the sub-circuits of the electronic circuit are identical. This leads to significantly more efficient production since the rejects that arise during the processing of the sub-circuits prove to be significantly fewer than those that arise during processing of correspondingly larger overall electronic circuits. A further advantage is an increased flexibility of the circuit construction. This is because adapted or altered electronic circuits can be produced from the identical sub-circuits by changing the substrate connection or by adapting the number of sub-circuits. By way of example, a single-phase circuit can be made into a polyphase circuit of the same type by a plurality of the corresponding sub-circuits used being arranged in parallel. As a further example, a single-phase circuit can be produced from a polyphase circuit by altering the electrical connection of the sub-circuits. A further possibility relates to producing a circuit having a higher power capacity by circuits of the same type being connected in parallel.

The sub-circuits may be anchored by mounts on the common carrier. As an alternative, they can also be anchored by a soldering connection, adhesive-bonding connection or other connection. In the case of a circuit having power semiconductor components, it is advantageous if the connection has a high thermal conductivity in order to permit good spreading of the waste heat from the components. The use of mounts has the advantage, however, of being less susceptible to thermo-mechanical loads and of producing a better thermal coupling to the common carrier.

BRIEF DESCRIPTION OF THE DRAWINGS

These and other aspects and advantages will become more apparent and more readily appreciated from the following description of exemplary embodiments, taken in conjunction with the accompanying drawings of which.

DETAILED DESCRIPTION OF THE PREFERRED EMBODIMENT

Figure 1:
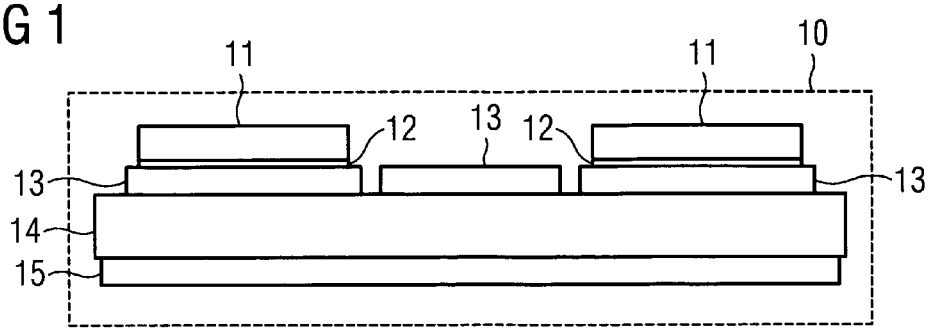
FIG. 1 is a side view of a sub-circuit on a DCB.

Reference will now be made in detail to the preferred embodiments, examples of which are illustrated in the accompanying drawings, wherein like reference numerals refer to like elements throughout.

FIG. 1 shows an exemplary sub-circuit 10 in side view, such as can be constructed. The sub-circuit 10 is composed of a DCB substrate 14 having an unstructured lower copper conductor track 15 on the underside. On the top side, the DCB substrate 14 has a structured upper copper conductor track 13. Two semiconductor chips 11 are applied on the upper copper conductor track 13 by solder layers 12. In this case, the upper copper conductor track 13 serves, by way of example, for electrically connecting electrical connections on the underside of the semiconductor chips 11. One possible alternative is the upper copper conductor track 13 not producing electrical connection, but rather serving only for dissipating heat loss from the semiconductor chips 11. In this case, it is expedient if the upper copper conductor track 13 has no structuring.

In this example, one of the two semiconductor chips 11 is intended to contain a diode 56, while the other semiconductor chip 11 contains an IGBT (IGBT=Insulated Gate Bipolar Transistor). It is clear that this construction is merely by way of example and semiconductor chips 11 having significantly more and/or more complex constructions, including in a mixture with individual electronic components, can also be used in other embodiment variants.

Figure 2:
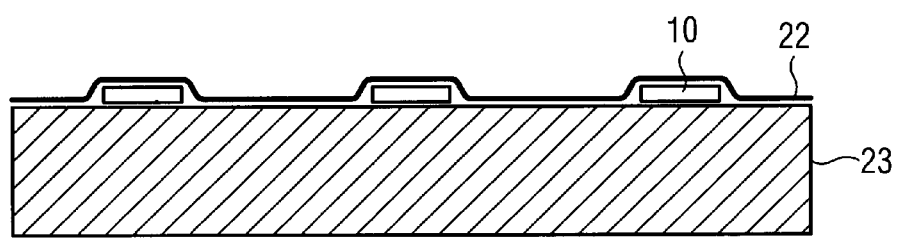
FIG. 2 is a cross sectional view of a plurality of sub-circuits arranged on a heat sink below an insulation layer construction with electrical connections.
Figure 3:
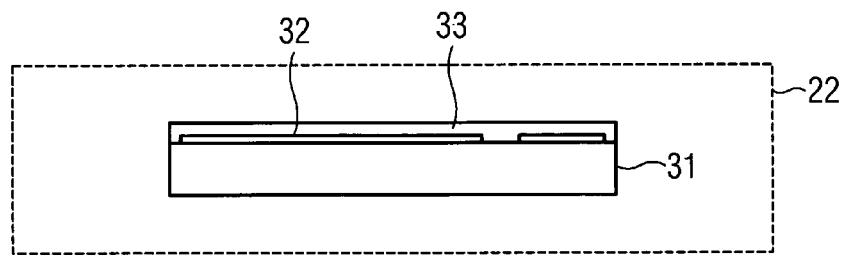
FIG. 3 is a side view of the insulation layer construction.

One exemplary possibility for the construction of an electronic circuit is shown in side view in FIG. 2. The electronic circuit is based on a heat sink 23 and has three sub-circuits 10 lying alongside one another, the sub-circuits being provided on the heat sink. The heat sink 23 and the sub-circuits 10 situated thereon are covered by a layer construction 22, which serves equally for electrical insulation and electrical connection. The precise construction of the layer construction 22 is shown in FIG. 3. The layer construction 22 is composed of a dielectric 31, to which a structured, planar copper conductor track 32 is applied. The dielectric 31 and the planar copper conductor track 32 are in turn covered by an insulating covering layer 33. The dielectric 31 and the insulating covering layer 33 are embodied as plastic films and can therefore be laminated onto the heat sink 23 with the sub-circuits 10 successively, for example, with introduction of the planar copper conductor track 32.

Figure 4A:
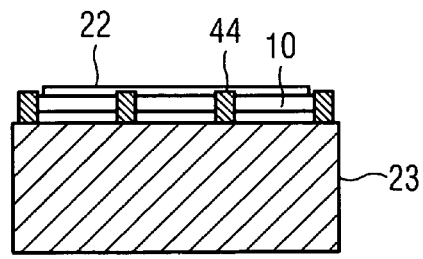
FIGS. 4A and 4B are cross sectional views of two possibilities for the construction of the sub-circuits with mounts.
Figure 4B:
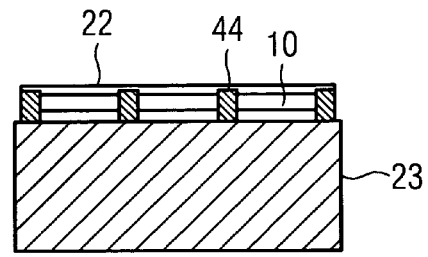

In accordance with FIG. 4, the sub-circuits 10 are fixed on the heat sink 23 by mounts 44. In this case, in accordance with FIG. 4, the sub-circuits 10 and the mounts 44 are arranged directly adjacent to one another, such that the layer construction 22, which in turn covers the sub-circuits 10 and the mounts 44, has to overcome height differences only to a small extent.

Figure 5:
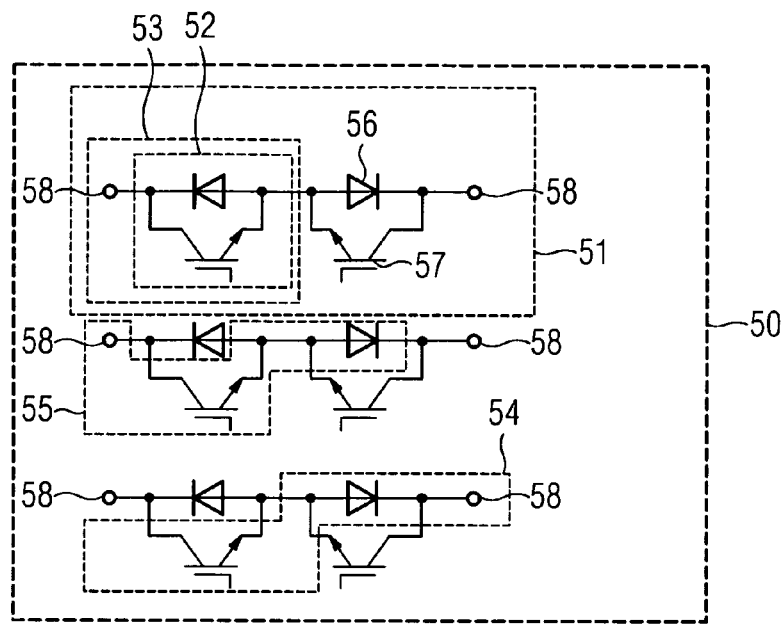
FIG. 5 is a circuit diagram for a modularizable three-phase switch.
Figure 6:
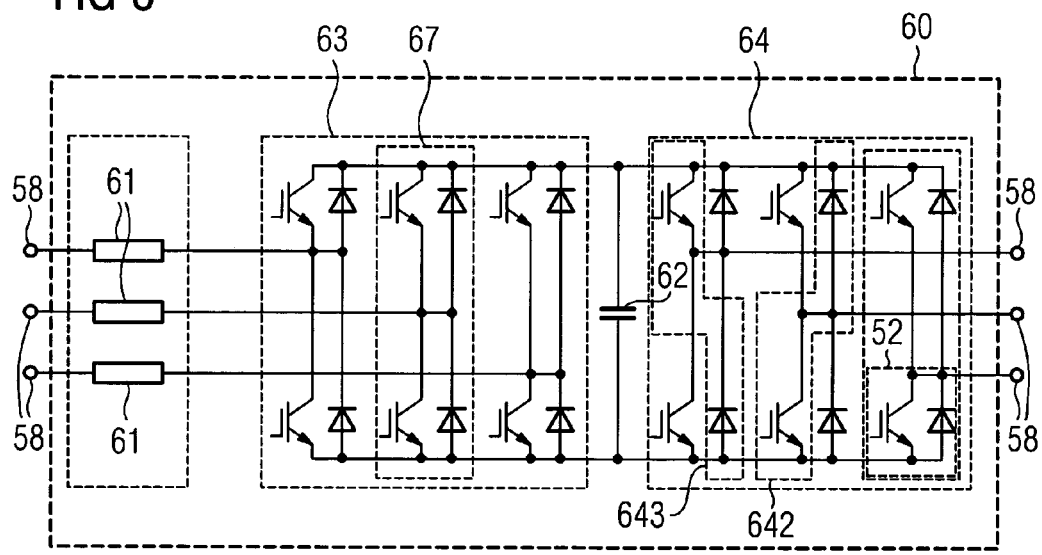
FIG. 6 is a circuit diagram for a modularizable three-phase converter system.

Concrete examples of modularizable circuits 50, 60 and the concrete implementation thereof by sub-substrates 10 are shown below. FIG. 5 schematically illustrates a three-phase switch 50. The three-phase switch 50 is composed of three electrically independent single-phase switches 51. Each of the single-phase switches 51 has two connecting terminals 58. The connecting terminals 58 are connected to one another by two half-switch modules 52, the half-switch modules 52 being reverse-connected in antiseries. Each of the half-switch modules 52 is composed of a parallel circuit formed by an IGBT 57 and a diode 56 as freewheeling diode.

The three-phase switch 50 is modularizable in a plurality of different ways. Thus, it is possible to construct the three-phase switch 50 from a sub-substrate 10 having six connecting terminals 58. Furthermore, a second sub-circuit 10 having six diodes 56 and a third sub-circuit 10 having six IGBTS 57 would be used. A further possible method uses three sub-circuits 10 which each realize a single-phase switch 51. Each of the sub-circuits 10 would therefore have two connecting terminals 58, two diodes 56 and two IGBTs 57. If this division into sub-circuits 10 were used, therefore, three identical sub-circuits 10 could be used for realizing the three-phase switch 50. A further fundamental possibility is the connecting terminals 58 not being integrated into the sub-circuits 10, but rather being applied directly to the underlying carrier, the cooling element 23 in this case.

For the three-phase switch 50 and also the converter system 60 described below, however, a third embodiment possibility is described below, using six sub-substrates 10, each of the sub-substrates 10 having a connecting terminal 58, a diode 56 and an IGBT 57. In order to achieve desired electrical properties such as resistance, dielectric strength or the like, circuits having a plurality of components can also be used instead of the individual components. Thus, instead of the individual diode 56, it is also possible to use a series circuit formed by diodes 56 typically of the same type. The IGBT 57 can also be replaced by a parallel circuit formed by a plurality of IGBTs 57. Of course, the circuit can also be composed of components of different types.

Figure 8:
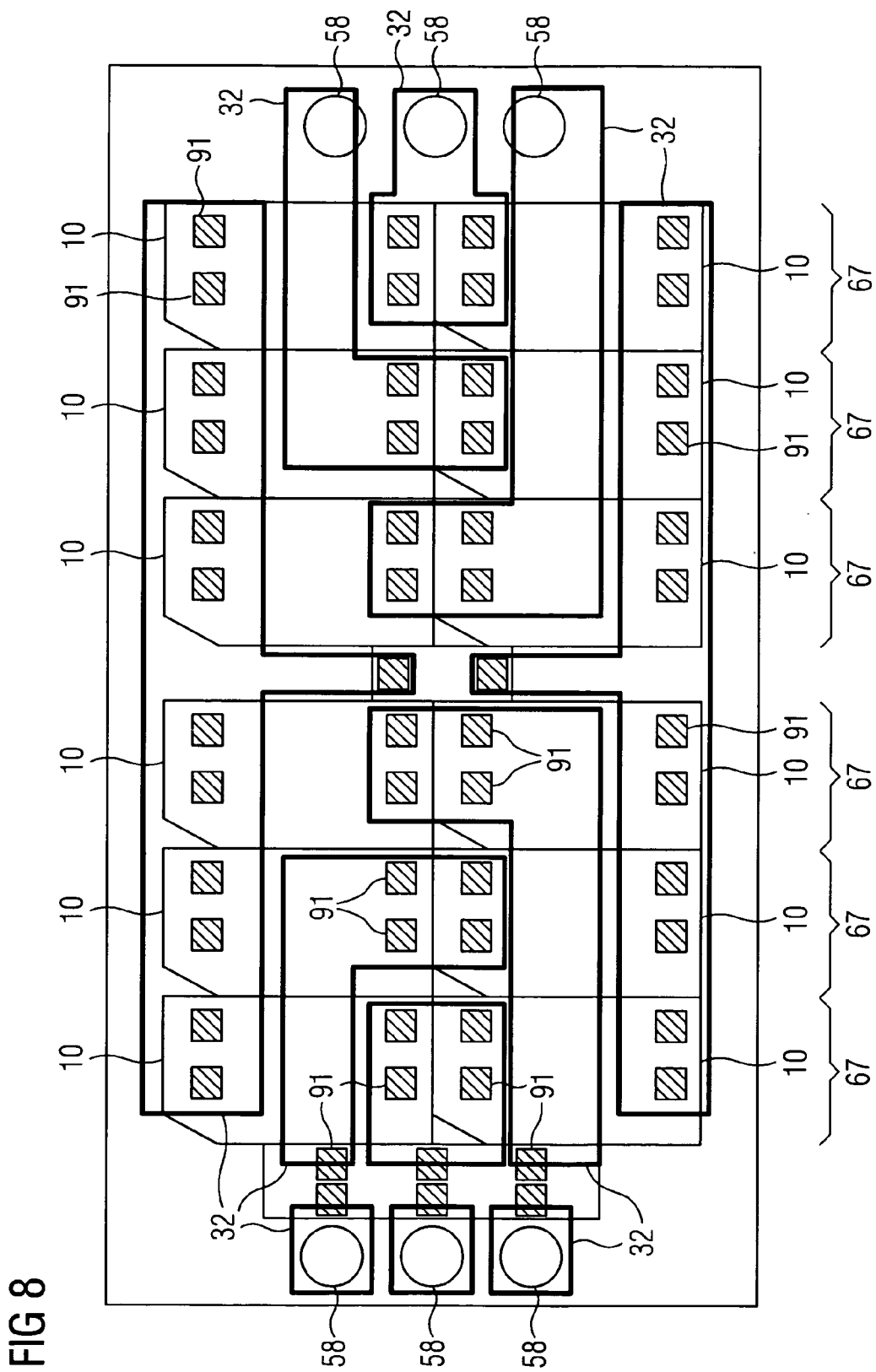
FIG. 8 is a block diagram illustrating the modularized construction composed of sub-circuits of the converter system.
Figure 9:
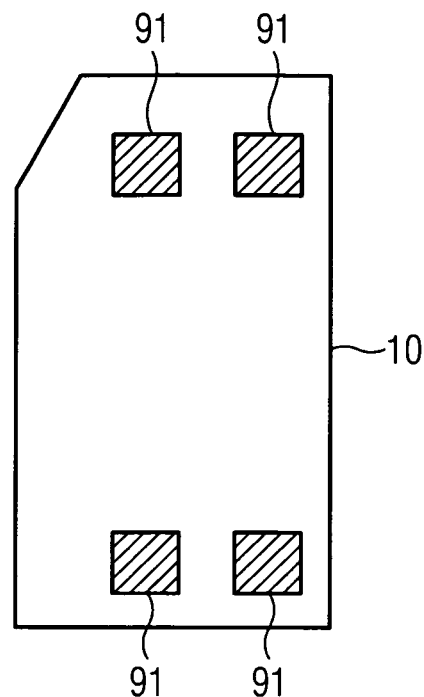
FIG. 9 is a block diagram illustrating the modularized construction of a sub-circuit of the converter system and of the three-phase switch.
Figure 10:
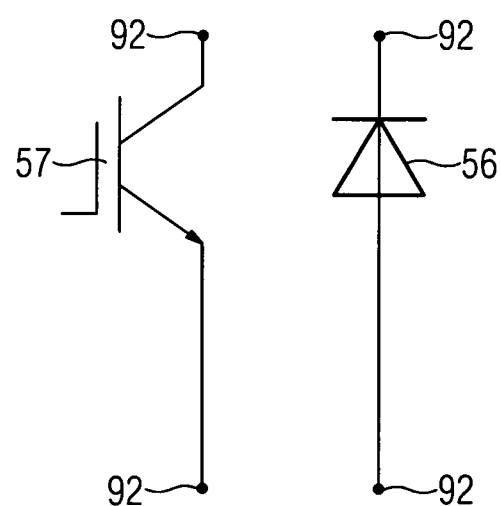
FIG. 10 is a circuit diagram for the sub-circuit.

For clarification purposes, FIG. 9 schematically shows a plan view of one of the sub-circuits 10. In accordance with FIG. 10, on the sub-circuit a diode 56 and an IGBT 57 are arranged without electrical connection to one another. The diode 56 has two connecting points 92 for the electrical connection. The IGBT 57 in turn actually has four electrical connections. For the sake of better clarity in the illustration, however, only two electrical connecting points 92 are shown. A total of four contact areas 91 are provided for the electrical connecting points 92 in accordance with FIG. 10. In the complete embodiment there would have to be six contact areas 91 owing to the actual number of four electrical connections of the IGBT 57. A window is expediently provided in the layer construction 22 in the dielectric 31 for each contact area 91, through which window the planar copper conductor track 32 can make electrical contact with the contact areas 91. It is pointed out that the dielectric 31 and the insulating covering layer 33 have been omitted in FIGS. 5 to 9 for reasons of clarity.

In the example in accordance with FIG. 9 it is assumed that no electrical connection at the sub-circuit level is effected between the diode 56 and the IGBT 57. As a result, the sub-circuit 10 in accordance with FIG. 9 has the greatest flexibility. However, all necessary electrical connections have to be subsequently created in the complete circuit, which can cause the construction of the copper conductor track 32 therein to become complex. Therefore, in one alternative to the possibility in accordance with FIG. 9, it is also possible for the two pairs of contact areas 91 to be electrically connected as early as on the sub-circuit 10 and thus to constrain a parallel circuit formed by diode 56 and IGBT 57. As a result, the flexibility of the sub-circuit 10 is considerably reduced, but the subsequent interconnection of a plurality of sub-circuits 10 is simplified in return.

One possible compromise is connecting only one of the pairs of contact areas 91. As a result, there is still the possibility of not using the IGBT 57 or the diode 56, by virtue of its respective other electrical connecting point 92 being left open. The further interconnection of the sub-circuits 10 is nevertheless simplified somewhat.

Figure 7:
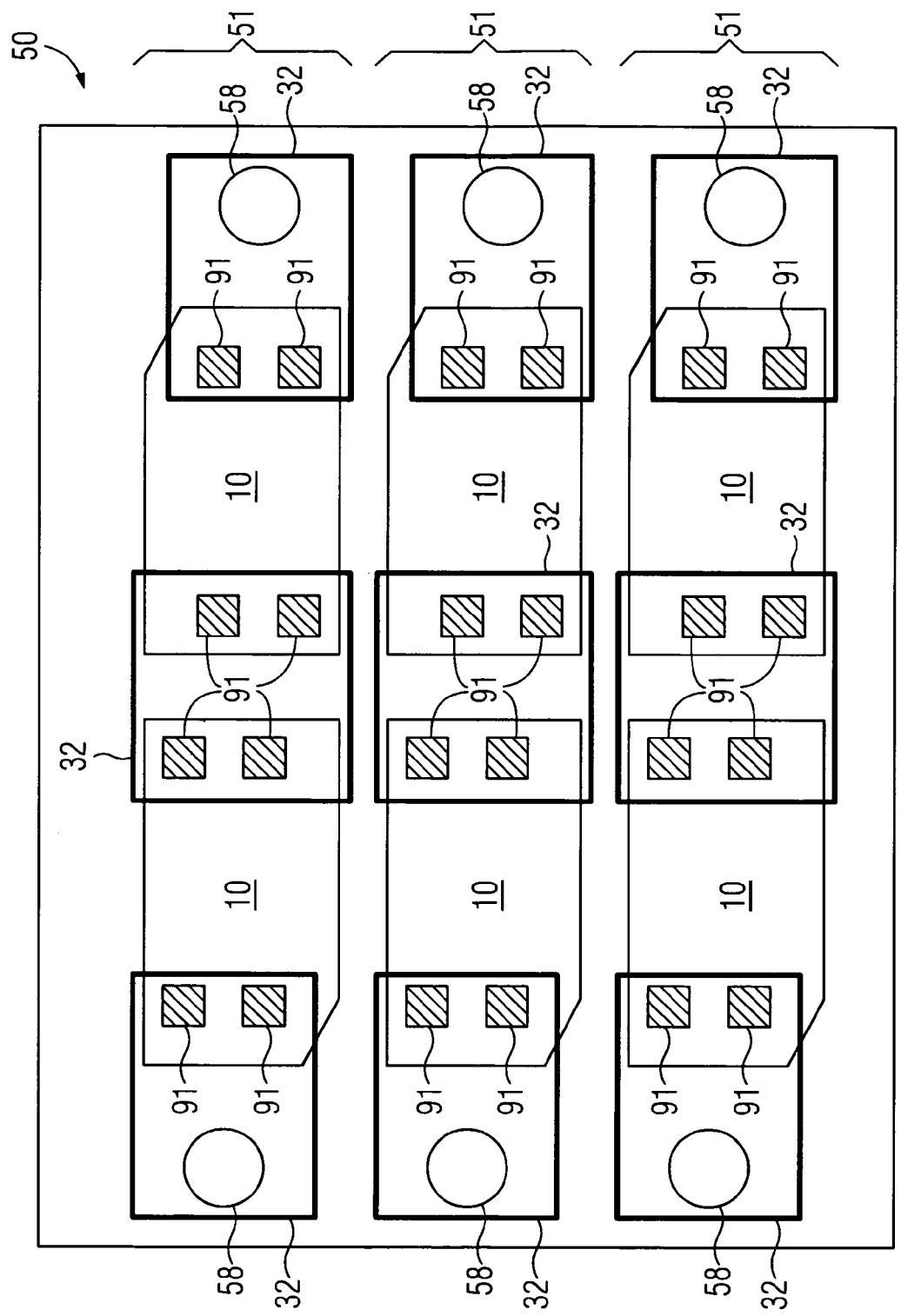
FIG. 7 is a block diagram illustrating the modularized construction with sub-circuits of the three-phase switch.

Assuming that initially no electrical connections whatsoever are provided on the sub-circuit 10, this results in a construction of the three-phase switch 50 as shown in FIG. 7. FIG. 7 shows in plan view the heat sink 23, on which the sub-circuits 10 are applied. In this case, the six identical sub-circuits 10 are arranged on the heat sink 23 in two columns each of three sub-circuits 10. Each row of two sub-circuits 10 in this arrangement realizes a single-phase switch 51. In accordance with FIG. 7, the sub-circuits 10 which realize a single-phase switch 51 are in this case arranged in such a way that one of the two sub-circuits 10 is rotated by 180°. This simplifies the electrical realization of the antiseries interconnection.

This arrangement shown in accordance with FIG. 7 also affords possibilities of wide variation. Thus, it is possible to dispense with the rotated arrangement of three of the sub-circuits 10 and nevertheless to achieve an antiseries connection by a corresponding planar copper conductor track 32. Moreover, the arrangement of the sub-circuits 10 in the 2×3 grid is not necessary. Moreover, the spacing of the sub-circuits 10 can be chosen to be larger or smaller.

In the example given here and also in the case of the converter 60 described below it is assumed that no electrical connections are realized in the sub-circuits 10. This means that the diode 56 and the IGBT 57 are first contact-connected by the planar copper conductor track 32. This is advantageous since the planar copper conductor track 32 also simultaneously produces the electrical connection between the sub-circuits 10 and, consequently, only a single step is necessary for electrically interconnecting the sub-circuits 10 and the three-phase switch 50. A separate wiring of each of the sub-circuits 10 is obviated. The planar copper conductor tracks 32 illustrated in FIG. 7 therefore serve for the connection of diode 56 and IGBT 57 of each of the sub-circuits 10 to form a respective parallel circuit, the antiseries connection of respectively two of these parallel circuits and the connection to the connecting terminals 58.

In this case, it should be taken into consideration that the embodiment mentioned above should be regarded only as an example. In the case of power electronic switches, the underside of the chips regularly has to be connected. In this case, this is usually done by the copper conductor track on the top side of the DCB.

A three-phase switch 50 is thus realized by the use of six identical sub-substrates 10.

A converter system 60 is shown below as a possibility for a further exemplary embodiment. The converter system 60 has three connecting terminals 58 as inputs. The latter are connected to a respective commutation inductor 61. The commutation inductors 61 are in turn connected to a respective section of a first IGBT bridge 63. Two outputs of the first IGBT bridge 63 are connected to an intermediate circuit capacitor 62 and, in parallel therewith, to two connections of a second IGBT bridge 64. Taps lead from the second IGBT bridge 64 to three connecting terminals 58 as outputs.

In this case, the first and the second IGBT bridges 63, 64 are each composed of three half-bridges 67. The half-bridges 67 in turn are each composed of two half-switch modules 52, which, as also in the case of the three-phase switch 50, are each composed of an IGBT 57 and a diode 56 connected in parallel therewith. In the case of the half-bridge 67 of the converter system 60, however, the half-switch modules 52 of the half-bridges 67 are connected in series rather than in antiseries. In this case, taps in the center of the half-bridges 67 of the first IGBT bridge 63 lead individually to the commutation inductors 61, while center taps of the half-bridges 67 of the second IGBT bridge 64 lead to the connecting terminals 58 of the output. The half-bridges 67 of the first and second IGBT bridges 63, 64 are all connected in parallel on the outer side and are furthermore connected in parallel with the intermediate circuit capacitor 62.

The modularized form of the converter system 60 including sub-circuits 10 and planar copper conductor tracks 32 is illustrated schematically in FIG. 8. The modularized circuit is composed of twelve of the sub-circuits 10 that are also used in the case of the three-phase switch 50. An inductor sub-circuit 81 containing the commutation inductors 61 is additionally provided in the modularized circuit. In accordance with FIG. 8, planar copper conductor tracks 32 provide for a corresponding interconnection and electrical connection between the sub-circuits 10 and on the sub-circuits 10. As in the case of the three-phase switch 50, too, there are a plurality of possibilities for the modularization of the converter system 60 as well. The possibility shown in accordance with FIG. 8 was chosen since the sub-circuits 10 containing the half-switch modules 51 can be used both in the case of the three-phase switch 50 and in the case of the converter system 60. Therefore, different electronic circuits can be constructed here using totally identical sub-circuits 10, in which case some additional components are also necessary in the case of the converter system 60.

As an alternative, in the case of the converter system 60, it would be possible, for example, to provide a sub-circuit 10 for each of the half-bridges 67. If, on the sub-circuit, all four components, that is to say the two diodes 56 and the two IGBTs 57, were left without electrical connection in this case, then these sub-circuits could also be used in the case of the three-phase switch 50. In this case, however, in the case of the three-phase switch 50 and in the case of the converter system 60, it would be necessary to implement different electrical interconnections on the sub-circuit by the planar copper conductor track 32 in order to realize the series and antiseries arrangement of the half-switch modules 52.

Further possibilities of modularization both in the case of the converter system 60 and in the case of the three-phase switch 50 uses, in the case of the converter system 60, for example, a sub-circuit 10 for respectively one of the commutation groups 642, 643. Since the latter, in the same way as the half-bridges 67, are functionally composed of a diode 56 and an IGBT 57, that would not affect the sub-circuits 10 in the case of the example given. For the electrical interconnection, that is to say the planar copper conductor track 32, however, a different form would arise since other electrical connections would be necessary. In the case of the switch 50, instead of the half-switch module 52, a current path 54 could be realized by a sub-circuit 10, which—in this case—would likewise lead to no change in the sub-circuit 10, but to a change in the layout of the copper conductor track 32.

Ultimately, for the modularization of an electronic circuit 50, 60 into sub-circuits 10, it is necessary to find a compromise between the reusability of the sub-circuits 10, the size of the sub-circuits 10, the overall size of the electronic circuit and the complexity of the planar copper conductor tracks 32 required. Precisely in the case of power electronics, the particular advantages with regard to the better heat spreading and the reduced requirements made of heat sink and DCB are also manifested particularly effectively in this case.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A production method for an electronic circuit, comprising:
    producing at least two electronic sub-circuits, each having at least one electronic component on a separate insulating sub-carrier, arranged alongside one another on a common carrier; and
    electrically connecting the at least two electronic sub-circuits using a planar electrical contact-connection method, including at least deposition of a metallic layer, a planar electrical contact-connection having at least one metallic layer partly bridging between the electronic sub-circuits, and
    wherein at least two identical sub-circuits are produced in a common process and are connected alone or together with further sub-circuits to form the electronic circuit.

2. The production method as claimed in claim 1, wherein components appertaining to power electronics are used in the sub-circuits and a power electronic circuit is thus produced.

3. The production method as claimed in claim 2, further comprising producing at least one electrical connection within the sub-circuits by the planar electrical contact-connection method.

4. The production method as claimed in claim 3, further comprising producing electrical connections to connecting terminals by the planar electrical contact-connection method.

5. The production method as claimed in claim 4, wherein a heat sink is used as the common carrier.

6. The production method as claimed in claim 5, wherein the planar electrical contact-connection method comprises:
   applying an insulation film for electrical insulation to the common carrier and the sub-circuits;
   opening windows in the insulation film;
   applying a metallic starter layer; and
   electrolytically applying the metallic starter layer to the insulation film.

7. The production method as claimed in claim 6, wherein the planar contact-connection method further comprises applying electrically insulating layer after the metallic layer has been applied.

8. The production method as claimed in claim 1, further comprising producing mounts on the common carrier for anchoring the sub-circuits.

9. An electronic circuit comprising:
   at least two electronic sub-circuits, each having at least one electronic component on a respective separate insulating sub-carrier, arranged alongside one another on a common carrier; and
   a planar electrical contact-connection electrically connecting the at least two electronic sub-circuits, the planar electrical contact-connection having at least one metallic layer partly bridging between the electronic sub-circuits, and
   wherein at least two identical sub-circuits are produced in a common process and are connected alone or together with further sub-circuits to form the electronic circuit.

10. The electronic circuit as claimed in claim 9, wherein the electronic sub-circuits have components appertaining to power electronics, so that the electronic circuit is a power electronic circuit.

11. The electronic circuit as claimed in claim 10, wherein the planar contact-connection also provides at least one electrical connection within the electronic sub-circuits.

12. The electronic circuit as claimed in claim 11, further comprising connecting terminals to which the planar contact-connection provides electrical connections to at least one of the electronic sub-circuits.

13. The electronic circuit as claimed in claim 12, wherein the common carrier is a heat sink.

14. The electronic circuit as claimed in claim 13, wherein the planar contact-connection has an insulation film for electrical insulation below the metallic layer.

15. The electronic circuit as claimed in claim 14, wherein the planar contact-connection has an electrically insulating layer on the metallic layer and the insulation film.

16. The electronic circuit as claimed in claims 15, wherein at least two of the electronic sub-circuits are identical.

17. The electronic circuit as claimed in claim 16 comprising mounts on the common substrate for anchoring the electronic sub-circuits.

* * * * *